United States Patent
Chang et al.

(10) Patent No.: US 9,318,368 B2
(45) Date of Patent: Apr. 19, 2016

(54) PHOTOMASK AND METHOD FOR FORMING DUAL STI STRUCTURE BY USING THE SAME

(71) Applicant: TAIWAN SEMICONDUCTOR MANUFACTURING CO., LTD., Hsinchu (TW)

(72) Inventors: Fu-Cheng Chang, Tainan (TW); Chai-Der Yen, Tainan (TW); Fu-Tsun Tsai, Tainan (TW); Chi-Cherng Jeng, Tainan (JP); Chih-Mu Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 63 days.

(21) Appl. No.: 14/080,631

(22) Filed: Nov. 14, 2013

(65) Prior Publication Data
US 2015/0132919 A1   May 14, 2015

(51) Int. Cl.
*H01L 21/76*   (2006.01)
*H01L 21/762*  (2006.01)
*G03F 1/00*    (2012.01)

(52) U.S. Cl.
CPC ............ *H01L 21/76229* (2013.01); *G03F 1/00* (2013.01)

(58) Field of Classification Search
CPC ............ H01L 21/76224; H01L 23/544; H01L 53/5226; H01L 21/76877; H01L 23/49827; H01L 21/76802; H01L 21/31111; H01L 21/31116; H01L 21/31144; H01L 23/5329; H01L 23/53295; H01L 21/76229
USPC .......................... 438/427, 400, 424; 257/797
See application file for complete search history.

(56) References Cited

U.S. PATENT DOCUMENTS

| | | | |
|---|---|---|---|
| 2003/0052084 A1* | 3/2003 | Tabery | G01N 21/47 216/59 |
| 2007/0066030 A1* | 3/2007 | Kim | 438/427 |
| 2007/0166630 A1* | 7/2007 | Kim et al. | 430/5 |
| 2008/0160422 A1* | 7/2008 | Chen | G03F 1/29 430/5 |
| 2008/0283962 A1* | 11/2008 | Dyer | H01L 21/3086 257/513 |
| 2010/0184295 A1* | 7/2010 | Sato et al. | 438/702 |
| 2013/0295772 A1* | 11/2013 | Kim | H01L 21/308 438/694 |

* cited by examiner

*Primary Examiner* — Duy T Nguyen
(74) *Attorney, Agent, or Firm* — McDermott Will & Emery LLP

(57) ABSTRACT

In a method for manufacturing a dual shallow trench isolation structure, a substrate is provided, and a mask layer is formed on the substrate. The mask layer is patterned by using a photomask to form at least one first hole and at least one second hole in the mask layer, in which a depth of the at least one first hole is different from a depth of the at least one second hole. The mask layer and the substrate are etched to form at least one first trench having a first depth and at least one second trench having a second depth, in which the first depth is different from the second depth. The remaining mask layer is removed. A first isolation layer and A second isolation layer are respectively formed in the at least one first trench and the at least one second trench.

18 Claims, 7 Drawing Sheets

PHOTOMASK AND METHOD FOR FORMING DUAL STI STRUCTURE BY USING THE SAME

BACKGROUND

Description of Related Art

CMOS image sensors (CIS) are used in various applications, such as mobile phones, notebooks, digital still cameras (DSC), digital videos (DV) and digital video recorders (DVR). The CMOS image sensors utilize an array of image sensor elements, each of which comprises a photodiode and other elements, to convert images into digital data or electrical signals. Each CMOS image sensor typically includes a pixel region and a periphery region.

Dark current is current generated by the image sensor elements without illumination. The dark current is undesirable. Impurities in the silicon wafer in the pixel region, which may damage the silicon crystal lattices during processing, can introduce the dark current. Excessive dark current may cause leakage, thus resulting in poor device performance.

A shallow trench isolation (STI) is typically disposed in the silicon substrate to prevent current leakage between two adjacent elements. Currently, a dual STI structure has been developed for the CIS to improve the dark current issue, in which the depth of the STI in the pixel array region is shallower than that of the STI of the periphery region.

However, two photolithography processes are needed for the fabrication of the dual STI structure. Thus, two photomasks including different patterns are needed for the STI structures including two different depths. Therefore, the fabrication of the dual STI structure is costly and time-consuming.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
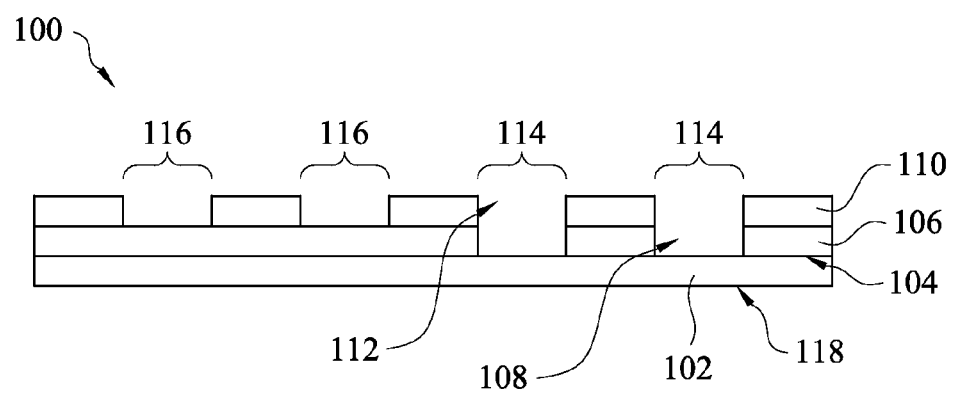
FIG. 1 is a schematic cross-sectional view of a photomask in accordance with various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a conventional process for fabricating a dual STI structure, in order to form a dual STI structure, two photolithography processes and two photomasks including different patterns are needed for fabricating STI structures including two different depths. That is, a first photolithography operation and a first etching operation are performed to form trenches of STI structures having a first depth, and a second photolithography operation and a second etching operation are then performed to deepen a part of the STI structures to a second depth. Thus, the process for fabricating the dual STI structure is complicated, costly and time-consuming.

Embodiments of the present disclosure are directed to providing a photomask for fabricating a dual STI structure using one photolithography process. The photomask includes at least two transparent regions of different transparency.

FIG. 1 is a schematic cross-sectional view of a photomask in accordance with various embodiments. As shown in FIG. 1, a photomask 100 includes a transparent substrate 102, a first pattern layer 106 and a second pattern layer 110. The transparent substrate 102 includes two opposite surfaces 104 and 118. The transparent substrate 102 is a flat plate, i.e. both the surfaces 104 and 118 are flat surfaces. In some embodiments, the transparent substrate 102 is formed from quartz.

The first pattern layer 106 is disposed on a portion of the surface 104 of the transparent substrate 102. The first pattern layer 106 includes at least one first opening 108. In the embodiment shown in FIG. 1, the first pattern layer 106 includes two first openings 108. The first openings 108 expose portions of the surface 104 of the transparent substrate 102 to define the pattern of the first pattern layer 106. The first pattern layer 106 is a transparent layer and is formed from a material pervious to light. In some embodiments, the first pattern layer 106 and the transparent substrate 102 are formed from different materials. In some embodiments, the first pattern layer 106 and the transparent substrate 102 are formed from the same material. In such embodiments, transparency of the regions where the first openings 108 are located is different from that of the regions where the first pattern layer 106 is overlapped with the transparent substrate 102. In some exemplary examples, the first pattern layer 106 includes molybdenum silicide.

The second pattern layer 110 is disposed above the surface 104 of the transparent substrate 102 and stacked on a portion of the first pattern layer 106. The second pattern layer 110 includes a plurality of second opening 112, as shown in FIG. 1. The first openings 108 are overlapped with some of the second openings 112, i.e. one first opening 108 is correspondingly overlapped with one second opening 112. In addition, some of the second openings 112 are located on the first pattern layer 106 and expose portions of the first pattern layer 106. The second openings 112 define the pattern of the second pattern layer 110. The overlapping of each first opening 108 and its corresponding second opening 112 forms a first transparent region 114. Thus, in the embodiment shown in FIG. 1, the photomask 100 includes two first transparent regions 114. Each second opening 116 located on the first pattern layer 106 forms one second transparent region 116. In the photomask 100, transparency of the first transparent regions 114 is different from that of the second transparent regions 116.

In some embodiments, the second pattern layer 110 is formed from a material pervious to light. The second pattern layer 110 and the first pattern layer 106 may be formed from the same material, or may be formed from different materials. In such embodiments, transparency of the regions where the second pattern layer 110 is overlapped with the first pattern layer 106 is different from that of the first transparent regions 114 and that of the second transparent regions 116. In some embodiments, the second pattern layer is an opaque layer. In some examples, the second pattern layer 110 includes chromium.

Figure 2A:
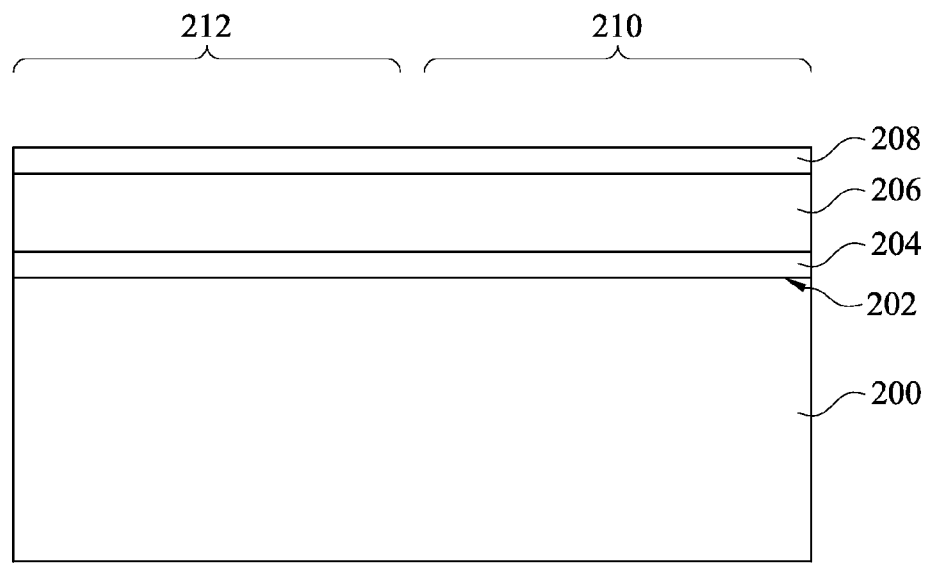
FIG. 2A through FIG. 2F are schematic cross-sectional views of intermediate stages showing a method for manufacturing a dual shallow trench isolation structure in accordance with various embodiments.

Referring to FIG. 2A through FIG. 2F, FIG. 2A through FIG. 2F are schematic cross-sectional views of intermediate stages showing a method for manufacturing a dual shallow trench isolation structure in accordance with various embodiments. The method can be used to manufacture a dual shallow trench isolation structure of an image sensor, such as a CIS, a charge coupled device (CCD) sensor or the likes. As shown in FIG. 2A, a substrate 200 is provided. The substrate 200 includes a pixel region 212 and a periphery region 210. The substrate 200 is a semiconductor substrate. The substrate 200 is composed of a single-crystalline semiconductor material or a compound semiconductor material. In some embodiments, the substrate 200 is a silicon substrate. In some embodiments, carbon, germanium, gallium, arsenic, nitrogen, indium, phosphorus, and/or the like, is also used as a material of the substrate 200.

In some embodiment, a pad oxide layer 204 is optionally formed on a surface 202 of the substrate 200 in both pixel region 212 and the periphery region 210. For example, the pad oxide layer 204 is formed using a thermal process. In addition, a hard mask layer 206 is optionally deposited on the pad oxide layer 204 above the substrate 200. In some examples, the hard mask layer 206 is formed from silicon nitride, silicon oxynitride or the likes. An oxide layer 208 is optionally deposited on the hard mask layer 206 above the substrate 200. In some examples, the oxide layer 208 is a silicon oxide layer.

Figure 2B:
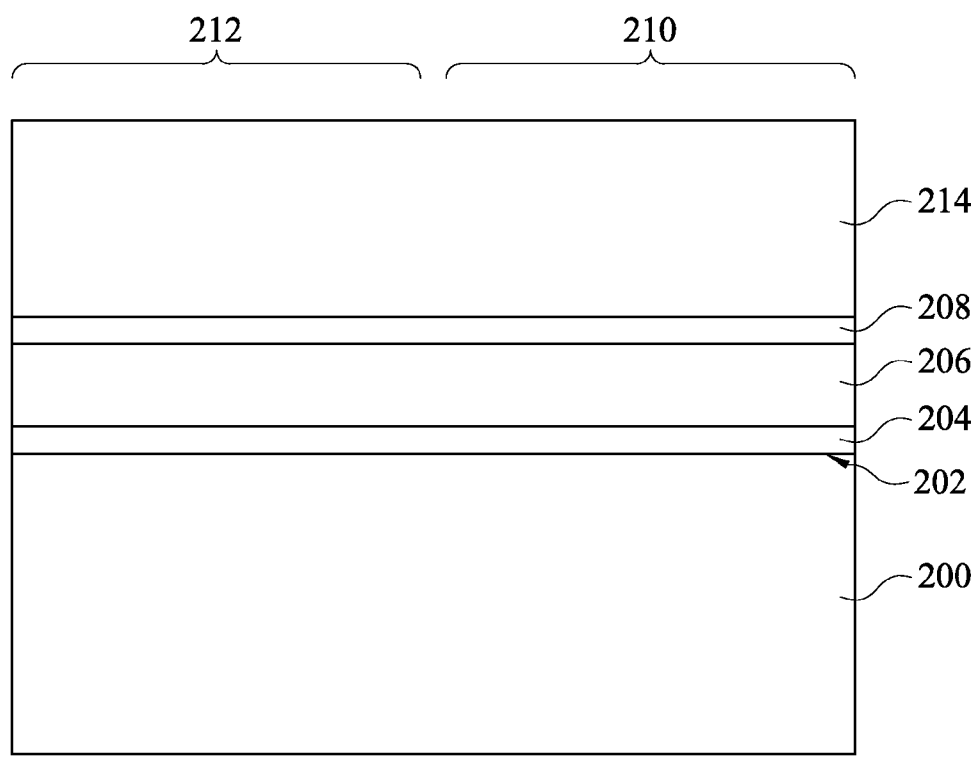

As shown in FIG. 2B, a mask layer 214 is formed on the oxide layer 208 above the surface 202 of the substrate 200 in both pixel region 212 and the periphery region 210. In some embodiments, the mask layer 214 is formed from photoresist, and the mask layer 214 is formed to cover the oxide layer 208 by spin coating.

Figure 2C:
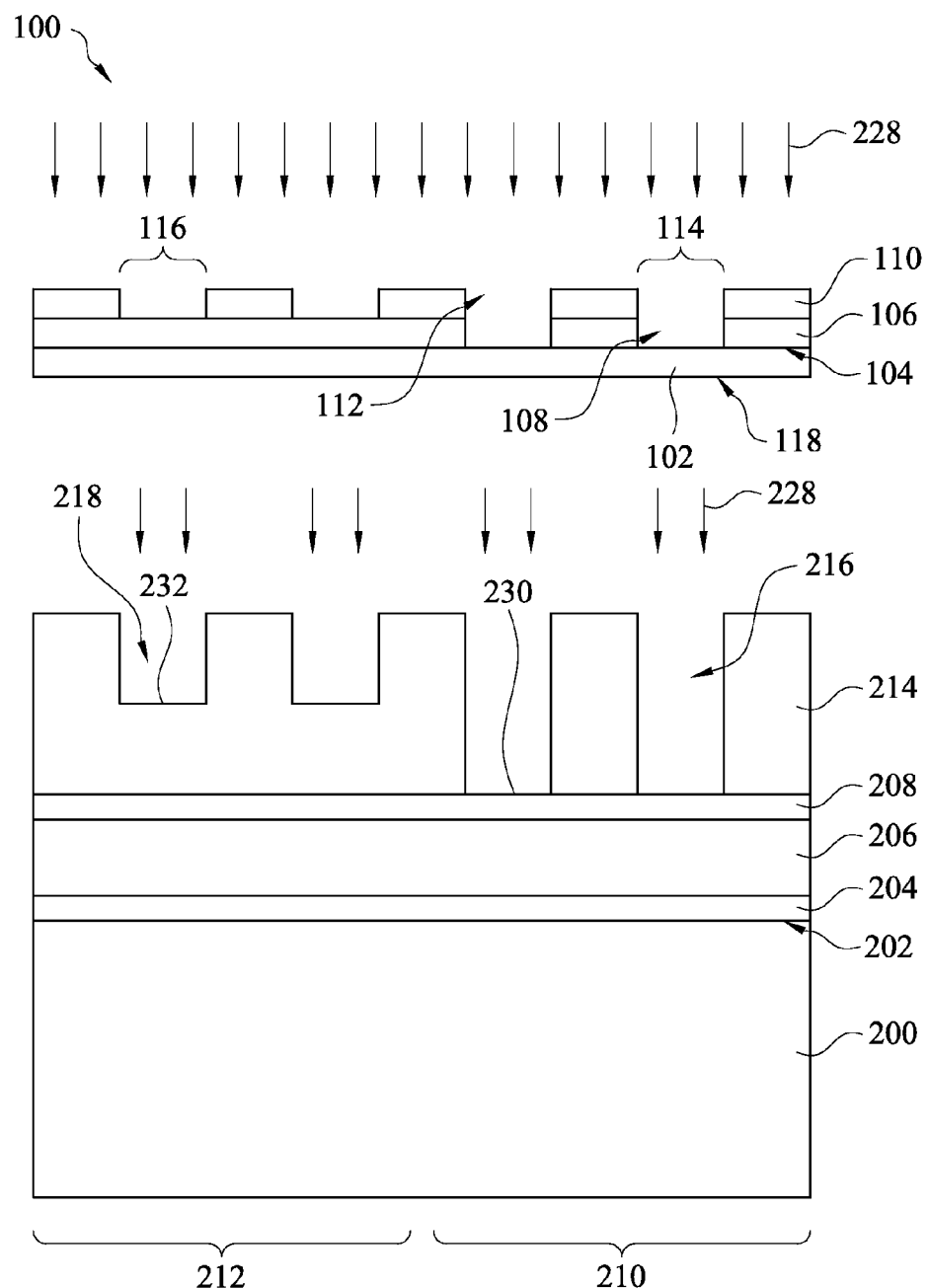

A photomask, such as the photomask 100 shown in FIG. 1, is prepared. The mask layer 214 is patterned by using the photomask 100. In some embodiments, in the operation of patterning the mask layer 214, the photomask 100 is disposed above the mask layer 214. Then, the mask layer 214 is exposed by radiation 228 through the photomask 100 to form latent images in the mask layer 214. The exposed mask layer 214 is developed to form first holes 216 and second holes 218 respectively corresponding to the first transparent regions 114 and the second transparent regions 116 in the photomask 100. The transparency of the first transparent regions 114 is different from that of the second transparent regions 116 in the photomask 100, so that depths of the latent images corresponding to the first transparent regions 114 are different from those of the latent images corresponding to the second transparent regions 116. Thus, after the exposed mask layer 214 is developed, depths of the first holes 216 are different from those of the second holes 218, as shown in FIG. 2C.

In some embodiments, a bottom end 230 of each first hole 216 exposes a portion of the oxide layer 208, and a bottom end 232 of each second hole 218 is located within the mask layer 214. Therefore, the depths of the first holes 216 are greater than those of the second holes 218. In the embodiment in which the mask layer 214 is directly disposed on the substrate 200, the bottom end 230 of each first hole 216 exposes a portion of the substrate 200. In the embodiment in which the mask layer 214 is directly disposed on the hard mask layer 206, the bottom end 230 of each first hole 216 exposes a portion of the hard mask layer 206. In certain embodiments, the bottom ends 230 of the first hole 216 and the bottom ends 232 of the second hole 218 are located within the mask layer 214, but the bottom ends 230 of the first holes 216 are located deeper than the bottom ends 232 of the second holes 218.

Figure 2D:
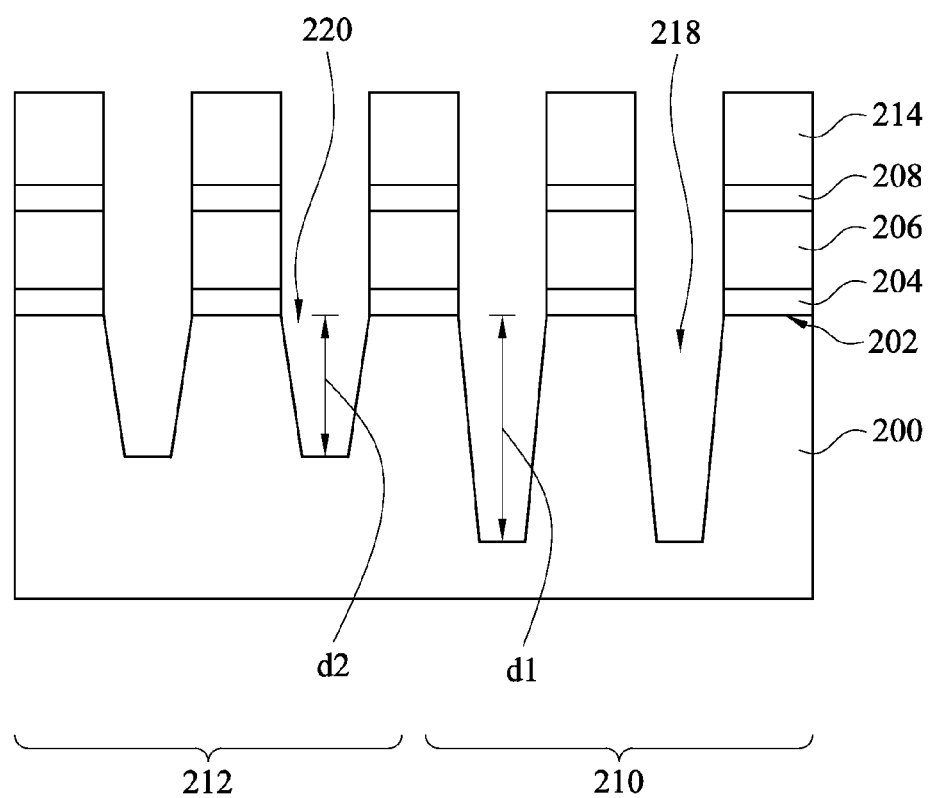

The mask layer 214, the oxide layer 208, the hard mask layer 206, the pad oxide layer 204 and the substrate 200 are etched to form first trenches 218 and second trenches 220 respectively corresponding to the first holes 216 and the second holes 218 in the substrate 200, as shown in FIG. 2D. In some embodiments, the oxide layer 208, the hard mask layer 206, the pad oxide layer 204 and the substrate 200 are etched by a dry etch process. Because the depths of the first holes 216 are different from those of the second holes 218, first depths d1 of the first trenches 218 are different from second depths d2 of the second trenches 220. In certain embodiments, the depths of the first holes 216 are greater than those of the second holes 218, so that the first depths d1 of the first trenches 218 are greater than the second depths d2 of the second trenches 220.

Figure 2E:
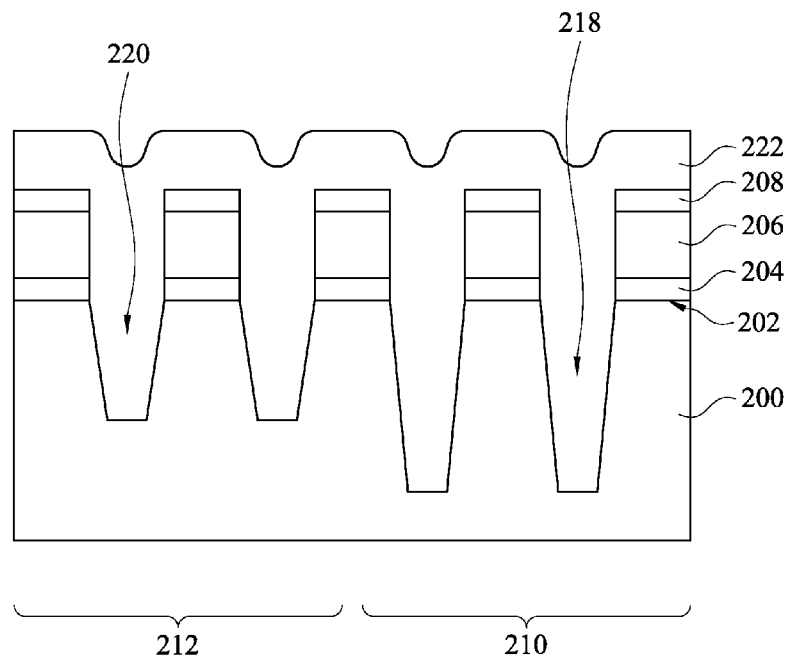
Figure 2F:
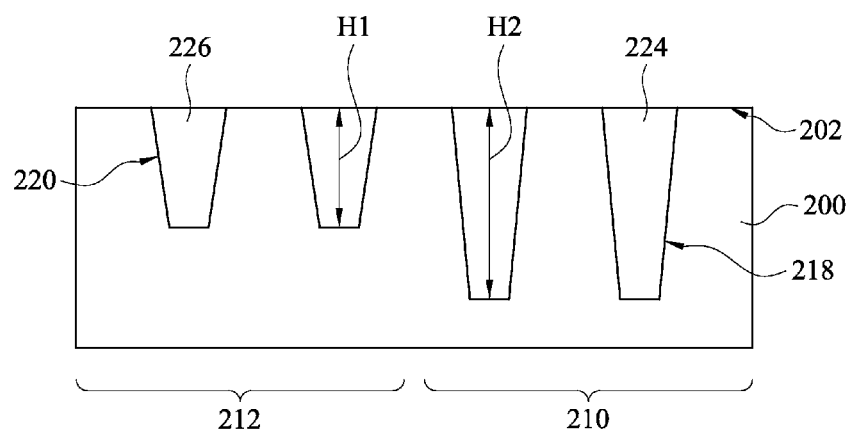

After the first trenches 218 and the second trenches 220 are formed, the remaining mask layer 214 is removed. Next, first isolation layers 224 and second isolation layers 226 are respectively formed within the first trenches 218 and the second trenches 220. In some embodiments, in the operation of forming the first isolation layers 224 and the second isolation layers 226, an isolating material layer 222 is formed to cover the oxide layer 208 and the substrate 200 and to fill the first trenches 218 and the second trenches 220. For example, the isolating material layer 222 is an oxide layer and is formed by using a high density plasma chemical vapor deposition (HDP CVD) technique or a TEOS oxide deposition technique. Then, the isolating material layer 222 located above the surface 202 of the substrate 200 is removed by, for example, polishing to form the first isolation layers 224 and the second isolation layers 226 respectively in the first trenches 218 and the second trenches 220, as shown in FIG. 2F. In some exemplary examples, the excess isolating material layer 222 is removed by using a chemical mechanical polishing (CMP) process. In certain examples, the remaining oxide layer 208, the remaining hard mask layer 206 and the remaining pad oxide layer 204 are removed during the operation of removing the excess isolating material layer 222 so as to complete the fabrication of the dual STI structure including the first isolation layers 224 and the second isolation layers 226. The first isolation layers 224 formed in the periphery region 210 have a first height H1, and the second isolation layers 226 formed in the pixel region 212 have a second height H2, in which the first height H1 is different from the second height H2. In certain examples, the first height H1 is greater than the second height H2.

By using the photomask 100 including the first transparent regions 114 and the second transparent regions 116 of different transparency, only one photolithography process is needed. Thus, the process for fabricating the dual STI structure is simplified, thus reducing the cost and time.

Figure 3:
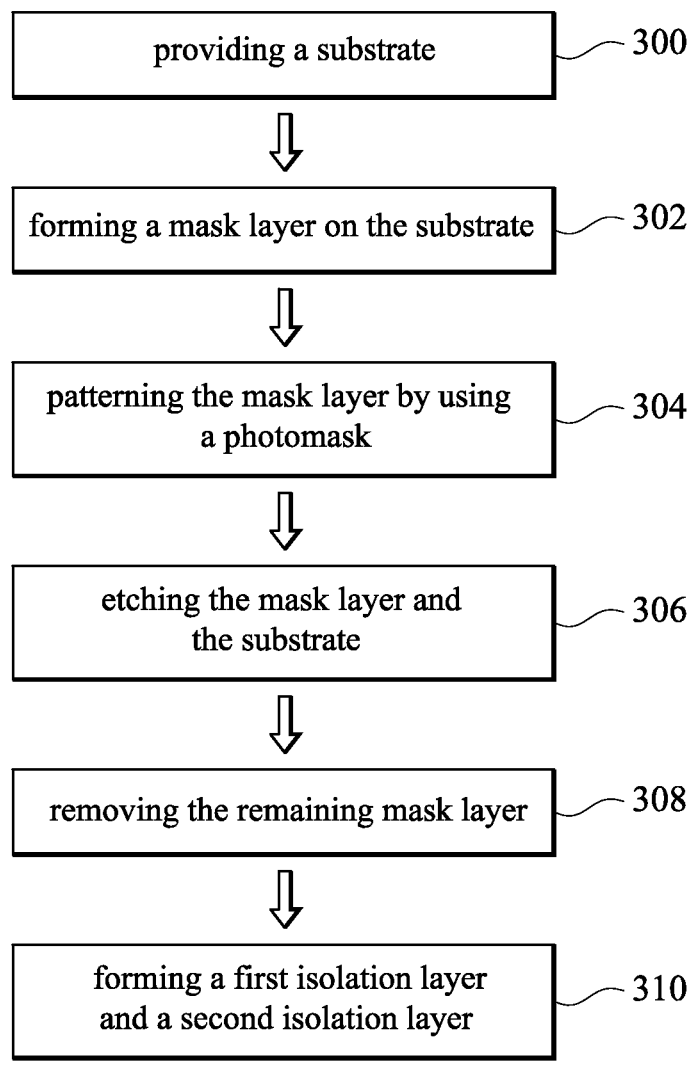
FIG. 3 is a flow chart of a method for manufacturing a dual shallow trench isolation structure in accordance with various embodiments.

Referring to FIG. 3 with FIG. 2B through 2D, FIG. 2F and FIG. 1, FIG. 3 is a flow chart of a method for manufacturing a dual shallow trench isolation structure in accordance with various embodiments. The method begins at operation 300, where a substrate 200 is provided. At operation 302, a mask layer 214, such as a photoresist layer, is formed on a surface 202 of the substrate 204, as shown in FIG. 2B. In some embodiments, the mask layer 214 is formed from photoresist. At operation 304, as shown in FIG. 2C, the mask layer 214 is patterned by using a photomask 100, such as shown in FIG. 1, and a photolithography process including exposing and developing. The transparency of the first transparent regions 114 is different from transparency of the second transparent regions 116 in the photomask 100, so that depths of the first holes 216 are different from those of the second holes 218. In some embodiments, the depths of the first holes 216 are greater than those of the second holes 218.

At operation 306, the mask layer 214 and the substrate 200 are etched using, for example, a dry etch technique, to form first trenches 218 and second trenches 220 in the substrate 200, as shown in FIG. 2D. Because the depths of the first holes 216 are different from those of the second holes 218, first depths d1 of the first trenches 218 are different from second depths d2 of the second trenches 220. In some embodiments, the depths of the first holes 216 are greater than those of the second holes 218, and the first depths d1 of the first trenches 218 are greater than the second depths d2 of the second trenches 220. At operation 308, the remaining mask layer 214 is removed. At operation 310, first isolation layers 224 and second isolation layer 226 are respectively formed in the first trenches 218 and the second trenches 220 to complete the dual STI structure, as shown in FIG. 2F.

Figure 4:
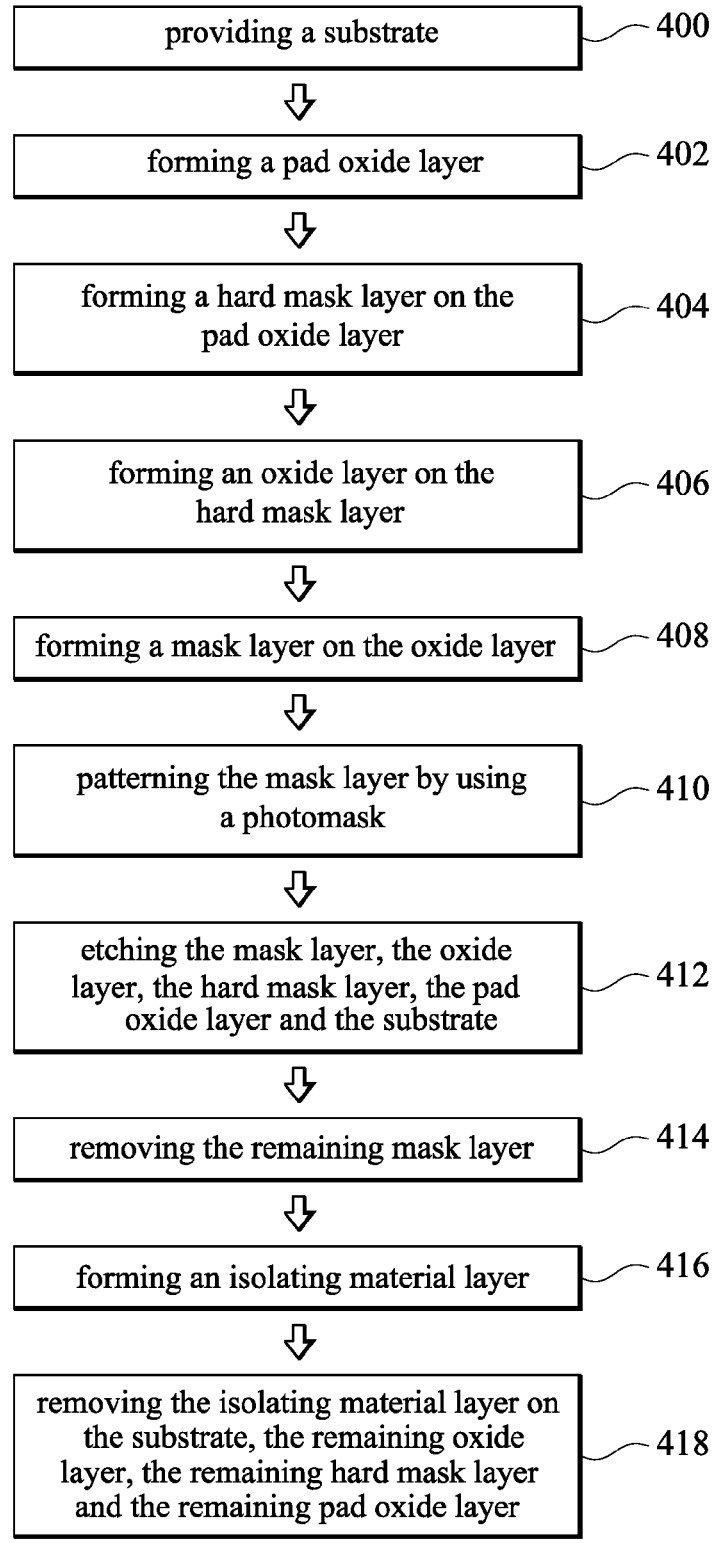
FIG. 4 is a flow chart of a method for manufacturing a dual shallow trench isolation structure in accordance with various embodiments.

Referring to FIG. 4 with FIG. 2A through FIG. 2F and FIG. 1, FIG. 4 is a flow chart of a method for manufacturing a dual shallow trench isolation structure in accordance with various embodiments. The method begins at operation 400, where a substrate 200 is provided. At operation 402, a pad oxide layer 204 is formed on a surface 202 of the substrate 200. At operation 404, a hard mask layer 206 is deposited on the pad oxide layer 204. For example, the hard mask layer 206 is formed from silicon nitride, silicon oxynitride or the likes. At operation 406, as shown in FIG. 2A, an oxide layer 208 is deposited on the hard mask layer 206 above the substrate 200. At operation 408, a mask layer 214 is formed on the oxide layer 208 above the substrate 200 in both pixel region 212 and the periphery region 210, as shown in FIG. 2B. In some embodiments, the mask layer 214 is formed from photoresist.

At operation 410, as shown in FIG. 2C, the mask layer 214 is patterned by using a photomask 100, such as shown in FIG. 1, and a photolithography process, which includes exposing and developing. The transparency of the first transparent regions 114 is different from transparency of the second transparent regions 116 in the photomask 100, so that depths of the first holes 216 are different from those of the second holes 218. In some embodiments, the depths of the first holes 216 are greater than those of the second holes 218. At operation 412, the mask layer 214, the oxide layer 208, the hard mask layer 206, the pad oxide layer 204 and the substrate 200 are etched using, for example, a dry etch technique, to form first trenches 218 and second trenches 220 in the substrate 200, as shown in FIG. 2D. Because the depths of the first holes 216 are different from those of the second holes 218, first depths d1 of the first trenches 218 are different from second depths d2 of the second trenches 220. In some embodiments, the depths of the first holes 216 are greater than those of the second holes 218, and the first depths d1 of the first trenches 218 are greater than the second depths d2 of the second trenches 220. At operation 414, the remaining mask layer 214 is removed. At operation 416, as shown in FIG. 2E, an isolating material layer 222 is formed to cover the oxide layer 208 and the substrate 200 and to fill the first trenches 218 and the second trenches 220. At operation 418, the isolating material layer 222 located above the surface 202 of the substrate 200 is removed to form first isolation layers 224 and second isolation layers 226 respectively in the first trenches 218 and the second trenches 220, as shown in FIG. 2F. In some exemplary examples, the excess isolating material layer 222 is removed by using a chemical mechanical polishing process. In certain examples, the remaining oxide layer 208, the remaining hard mask layer 206 and the remaining pad oxide layer 204 are removed during the operation of removing the excess isolating material layer 222 to complete the fabrication of the dual STI structure. A first height H1 of each first isolation layer 224 formed in the periphery region 210 is different from a second height H2 of each second isolation layer 226 formed in the pixel region 212. In certain examples, the first height H1 is greater than the second height H2.

In accordance with an embodiment, the present disclosure discloses a method for manufacturing a dual shallow trench isolation structure. In this method, a substrate is provided. A mask layer is formed on the substrate. The mask layer is patterned by using a photomask to form at least one first hole and at least one second hole in the mask layer, in which a depth of the at least one first hole is different from a depth of the at least one second hole. The mask layer and the substrate are etched to form at least one first trench having a first depth and at least one second trench having a second depth, in which the first depth is different from the second depth. The remaining mask layer is removed. A first isolation layer and a second isolation layer are respectively formed in the at least one first trench and the at least one second trench.

In accordance with another embodiment, the present disclosure discloses a photomask suitable for manufacturing a dual shallow trench isolation structure. The photomask includes a transparent substrate, a first pattern layer and a second pattern layer. The first pattern layer is disposed on a portion of a surface of the transparent substrate and comprises at least one first opening. The second pattern layer is stacked on a portion of the first pattern layer and comprises a plurality of second openings, in which the at least one first opening is overlapped with at least one of the second openings to form at least one first transparent region, the other ones of the second openings are located on the first pattern layer to form at least one second transparent region, and transparency of the at least one first transparent region is different from transparency of the at least one second transparent region.

In accordance with yet another embodiment, the present disclosure discloses a method for manufacturing a dual shallow trench isolation structure. In this method, a substrate is provided. A hard mask layer is formed on the substrate. A mask layer is formed on the hard mask layer. The mask layer is patterned by using a photomask to form at least one first hole and at least one second hole in the mask layer, in which a depth of the at least one first hole is different from a depth of the at least one second hole. The mask layer, the hard mask layer and the substrate are etched to form at least one first trench having a first depth and at least one second trench having a second depth, in which the first depth is different from the second depth. The remaining mask layer is removed. An isolating material layer is formed to cover the hard mask layer and fill the at least one first trench and the at least one second trench. The isolating material layer on the hard mask layer and the hard mask layer are removed.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a dual shallow trench isolation structure, the method comprising:
    forming a photomask with a variable transparency stacking substrate, wherein the variable transparency stacking substrate comprises at least one first transparent region and at least one second transparent region, and transparency through a recess portion of the at least one first transparent region is different from transparency through a recess portion of the at least one second transparent region;
    providing a substrate;
    forming a photoresist layer on the substrate;
    performing an exposure and development process on the photoresist layer by using the photomask to form at least one first hole and at least one second hole in the photoresist layer, the at least one first hole and the at least one second hole corresponding to the at least one first transparent region and the at least one second transparent region respectively, wherein a depth of the at least one first hole is different from a depth of the at least one second hole;
    etching the photoresist layer and the substrate to form at least one first trench having a first depth and at least one second trench having a second depth, wherein the first depth is different from the second depth;
    removing the remaining photoresist layer; and
    forming a first isolation layer and a second isolation layer respectively in the at least one first trench and the at least one second trench.

2. The method of claim 1, before the operation of forming the photoresist layer, further comprising forming a hard mask layer on the substrate.

3. The method of claim 1, before the operation of forming the photoresist layer, further comprising forming an oxide layer on the substrate.

4. The method of claim 1, wherein the operation of performing the exposure and development process on the photoresist layer comprises forming the at least one first hole having a bottom end exposing a portion of the substrate, and the at least one second hole having a bottom end located within the photoresist layer.

5. The method of claim 1, wherein the operation of performing the exposure and development process on the photoresist layer comprises forming the at least one first hole having a bottom end and the at least one second hole having a bottom end located within the photoresist layer.

6. The method of claim 1, wherein the operation of forming the photomask is performed to form the variable transparency stacking substrate comprising:
    a transparent substrate;
    a first pattern layer which is disposed on a portion of a surface of the transparent substrate and comprises at least one first opening; and
    a second pattern layer which is stacked on a portion of the first pattern layer and comprises a plurality of second openings, wherein the at least one first opening is overlapped with at least one of the second openings to form the at least one first transparent region, the other ones of the second openings are located on the first pattern layer to form the at least one second transparent region.

7. The method of claim 6, wherein the operation of performing the exposure and development process on the photoresist layer comprises:
    exposing the photoresist layer through the photomask; and
    developing the exposed photoresist layer.

8. The method of claim 1, wherein the operation of etching the photoresist layer and the substrate comprises:
    forming the at least one first trench and the at least one second trench respectively corresponding to the at least one first hole and the at least one second hole, wherein the first depth is greater than the second depth.

9. The method of claim 1, wherein the operation of forming the first isolation layer and the second isolation layer comprises:
    forming an isolating material layer covering the substrate and filling the at least one first trench and the at least one second trench; and
    removing the isolating material layer on the substrate.

10. The method of claim 9, wherein the operation of removing the isolating material layer on the substrate comprises removing the isolating material layer on the substrate using a chemical mechanical polishing method.

11. A method for manufacturing a dual shallow trench isolation structure, the method comprising:
    forming a photomask with a variable transparency stacking substrate, wherein the variable transparency stacking substrate comprises at least one first transparent region and at least one second transparent region, and transparency through a recess portion of the at least one first transparent region is different from transparency through a recess portion of the at least one second transparent region;
    providing a substrate;
    forming a hard mask layer on the substrate;
    forming a photoresist layer on the hard mask layer;
    performing an exposure and development process on the photoresist layer by using the photomask to form at least one first hole and at least one second hole in the photoresist layer, the at least one first hole and the at least one second hole corresponding to the at least one first transparent region and the at least one second transparent region respectively, wherein a depth of the at least one first hole is different from a depth of the at least one second hole;
    etching the photoresist layer, the hard mask layer and the substrate to form at least one first trench having a first depth and at least one second trench having a second depth, wherein the first depth is different from the second depth;
    removing the remaining photoresist layer;
    forming an isolating material layer to cover the hard mask layer and fill the at least one first trench and the at least one second trench; and
    removing the isolating material layer on the hard mask layer and the hard mask layer.

12. The method of claim 11, wherein the operation of performing the exposure and development process on the photoresist layer comprises forming the at least one first hole having a bottom end exposing a portion of the hard mask layer, and the at least one second hole having a bottom end located within the photoresist layer.

13. The method of claim 11, wherein the operation of etching the photoresist layer, the hard mask layer and the substrate comprises:
    forming the at least one first trench and the at least one second trench respectively corresponding to the at least one first hole and the at least one second hole, wherein the first depth is greater than the second depth.

14. The method of claim 11, before the operation of forming the hard mask layer, further comprising forming an oxide layer on the substrate.

15. The method of claim 11, between the operation of forming the hard mask layer and the operation of forming the photoresist layer, further comprising forming an oxide layer on the hard mask layer.

16. The method of claim 11, wherein the operation of performing the exposure and development process on the photoresist layer comprises forming the at least one first hole having a bottom end and the at least one second hole having a bottom end located within the photoresist layer.

17. The method of claim 11, wherein
the operation of forming the photomask is performed to form the variable transparency stacking substrate comprising:
a transparent substrate;
a first pattern layer which is disposed on a portion of a surface of the transparent substrate and comprises at least one first opening; and
a second pattern layer which is stacked on a portion of the first pattern layer and comprises a plurality of second openings, wherein the at least one first opening is overlapped with at least one of the second openings to form the at least one first transparent region, the other ones of the second openings are located on the first pattern layer to form the at least one second transparent region, and transparency of the at least one first transparent region is different from transparency of the at least one second transparent region; and
the operation of performing the exposure and development process on the photoresist layer comprises:
exposing the photoresist layer through the photomask; and
developing the exposed photoresist layer.

18. The method of claim 11, wherein the operation of removing the isolating material layer on the hard mask layer and the hard mask layer comprises removing the isolating material layer on the hard mask layer and the hard mask layer using a chemical mechanical polishing method.

* * * * *